United States Patent
Fukuda

(10) Patent No.: US 9,462,177 B2
(45) Date of Patent: Oct. 4, 2016

(54) FOCUS ADJUSTMENT APPARATUS, FOCUS ADJUSTMENT METHOD, STORAGE MEDIUM STORING FOCUS ADJUSTMENT PROGRAM, AND IMAGING APPARATUS

(71) Applicant: CANON KABUSHIKI KAISHA, Tokyo (JP)

(72) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 102 days.

(21) Appl. No.: 14/263,095

(22) Filed: Apr. 28, 2014

(65) Prior Publication Data

US 2014/0332661 A1 Nov. 13, 2014

(30) Foreign Application Priority Data

May 8, 2013 (JP) ................................. 2013-098529

(51) Int. Cl.
*H04N 5/232* (2006.01)
(52) U.S. Cl.
CPC ................................. *H04N 5/23212* (2013.01)
(58) Field of Classification Search
CPC ............................................... H04N 5/23212
USPC .......................... 250/201.7, 201.2; 348/222.1
See application file for complete search history.

(56) References Cited

U.S. PATENT DOCUMENTS

| 4,410,804 A | 10/1983 | Stauffer |
| 6,829,008 B1 | 12/2004 | Kondo et al. |
| 8,159,580 B2 * | 4/2012 | Suzuki ............... H01L 27/14603 250/208.1 |
| 8,953,091 B2 * | 2/2015 | Hamada ........................ 348/349 |
| 2013/0113987 A1 | 5/2013 | Fukuda |
| 2014/0146221 A1 | 5/2014 | Kimura et al. |
| 2014/0192220 A1 | 7/2014 | Kimura et al. |

FOREIGN PATENT DOCUMENTS

| EP | 1085751 A2 | 3/2001 |
| JP | 2000-156823 A | 6/2000 |
| JP | 2001-083407 A | 3/2001 |

OTHER PUBLICATIONS

U.S. Appl. No. 14/279,790, filed May 16, 2014.

* cited by examiner

*Primary Examiner* — Seung C Sohn
(74) *Attorney, Agent, or Firm* — Fitzpatrick, Cella, Harper & Scinto

(57) ABSTRACT

A focus adjustment apparatus has: an imaging unit that is capable of outputting a pair of focus detection signals by photoelectrically converting rays of light which pass through different pupil areas of a focusing optical system; a focus detection unit for detecting a first defocus amount by executing a first filter processing to the pair of focus detection signals; a determination unit for determining a focus state on the basis of the first defocus amount; an evaluation value generation unit for generating an evaluation value of the first defocus amount by executing a second filter processing to the pair of focus detection signals in accordance with a result of the determination; and a control unit for evaluating the result of the determination about the focus state on the basis of the evaluation value and controlling a focus adjustment in accordance with a result of the evaluation.

30 Claims, 9 Drawing Sheets

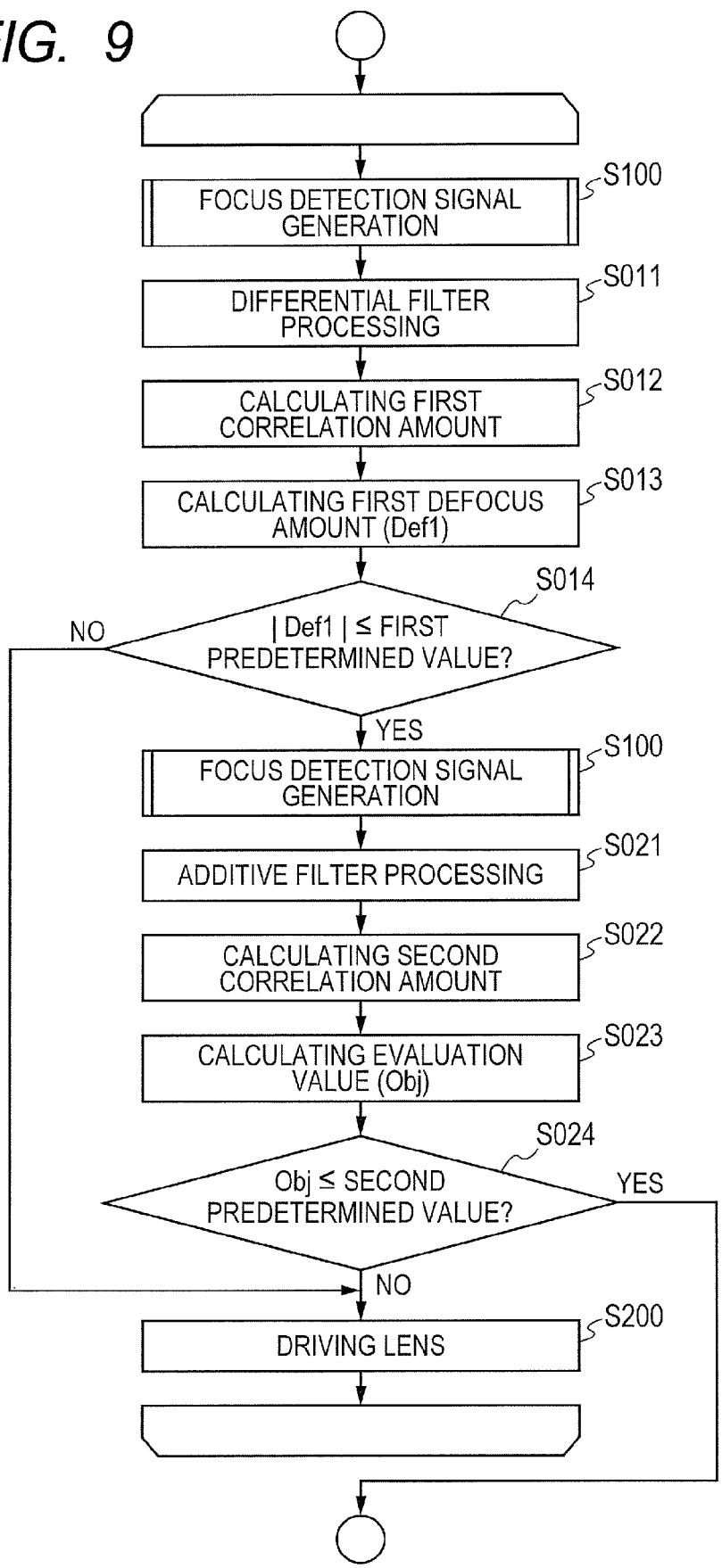

FOCUS ADJUSTMENT APPARATUS, FOCUS ADJUSTMENT METHOD, STORAGE MEDIUM STORING FOCUS ADJUSTMENT PROGRAM, AND IMAGING APPARATUS

BACKGROUND OF THE INVENTION

1. Field of the Invention

The present invention relates to a focus adjustment apparatus and a focus adjustment method and, more particularly, to a focus adjustment apparatus and a focus adjustment method for performing a focus adjustment by using pixel signals based on object light which passes through different exit pupils of a focusing optical system, and to a storage medium in which a focus adjustment program has been stored and an imaging apparatus.

2. Description of the Related Art

As one of focus adjustment methods of an imaging apparatus, there is an imaging plane phase difference method of performing a focus detection of a phase difference method with focus detection pixels formed on an imaging element. In a focus adjustment of the imaging plane phase difference method, a defocus direction and a defocus amount can be simultaneously detected by the focus detection pixels formed on the imaging element and the focus adjustment can be performed at a high speed.

For example, U.S. Pat. No. 4,410,804 discloses an imaging apparatus using a two-dimensional imaging element in which one microlens and a plurality of divided photoelectric conversion units are formed with respect to one pixel. The divided photoelectric conversion units are constructed so as to receive rays of light from different areas of an exit pupil of a photographing lens through one microlens, and attain a pupil division. A correlation amount is calculated from focus detection signals received by the divided photoelectric conversion units (focus detection pixels), an image shift amount is obtained from the correlation amount, and the focus detection of the phase difference method can be performed. The Official Gazette of Japanese Patent Application Laid-Open No. 2001-083407 discloses such a technique that an image pickup signal is generated by adding focus detection signals received by the divided photoelectric conversion units.

The Official Gazette of Japanese Patent Application Laid-Open No. 2000-156823 discloses such an imaging apparatus that a pair of focus detection pixels are partially arranged to a two-dimensional imaging element constructed by a plurality of image pickup pixels. In such an imaging apparatus, the pupil division is performed by constructing one set of focus detection pixels in such a manner that object light which passes through different areas of an exit pupil of a photographing lens is received by a light shielding layer having an aperture portion. There is also disclosed such a technique that image pickup signals are obtained by the image pickup pixels arranged in most of the two-dimensional imaging element, a correlation amount is calculated from pixel signals of the focus detection pixels which are partially arranged, and an image shift amount is obtained from the correlation amount, thereby performing the focus detection of the phase difference method.

However, according to the focus detection of the imaging plane phase difference method, since the pupil division is attained by using the microlens of the imaging element, the focus detection is affected by diffraction, so that a pupil division area is not a distinct area but appears as light receiving ratio distribution and a frame vignetting occurs by a lens frame or an iris frame of the photographing lens. When the frame vignetting occurs, an agreement of form between a pair of focus detection signals which are used for the phase difference deteriorates, a distortion is emphasized by a differential filter which emphasizes an edge, and there is such a problem that an erroneous in-focus detection (false in-focus detection) happens.

SUMMARY OF THE INVENTION

The invention is made in consideration of the foregoing problem and in a focus adjustment apparatus of an imaging plane phase difference method, a false in-focus detection is suppressed and a focus detection accuracy is improved.

According to the invention, a focus adjustment apparatus comprises: an imaging unit that is capable of outputting a pair of focus detection signals by photoelectrically converting rays of light which pass through different pupil areas of a focusing optical system; a first focus detection unit configured to detect a defocus amount by executing a first filter processing to the pair of focus detection signals; a determination unit configured to determine a focus state on the basis of the first defocus amount; an evaluation value generation unit configured to generate an evaluation value of the first defocus amount by executing a second filter processing to the pair of focus detection signals in accordance with a result of the determination about the focus state; and a control unit configured to evaluate the result of the determination about the focus state on the basis of the evaluation value and control a focus adjustment in accordance with a result of the evaluation.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 9 is a diagram illustrating a flowchart for the focus adjustment operation according to the first embodiment of the invention.

DESCRIPTION OF THE EMBODIMENTS

Various exemplary embodiments, features, and aspects of the present invention will be described in detail below with reference to the drawings.

Embodiment 1

Whole Construction

Figure 1:
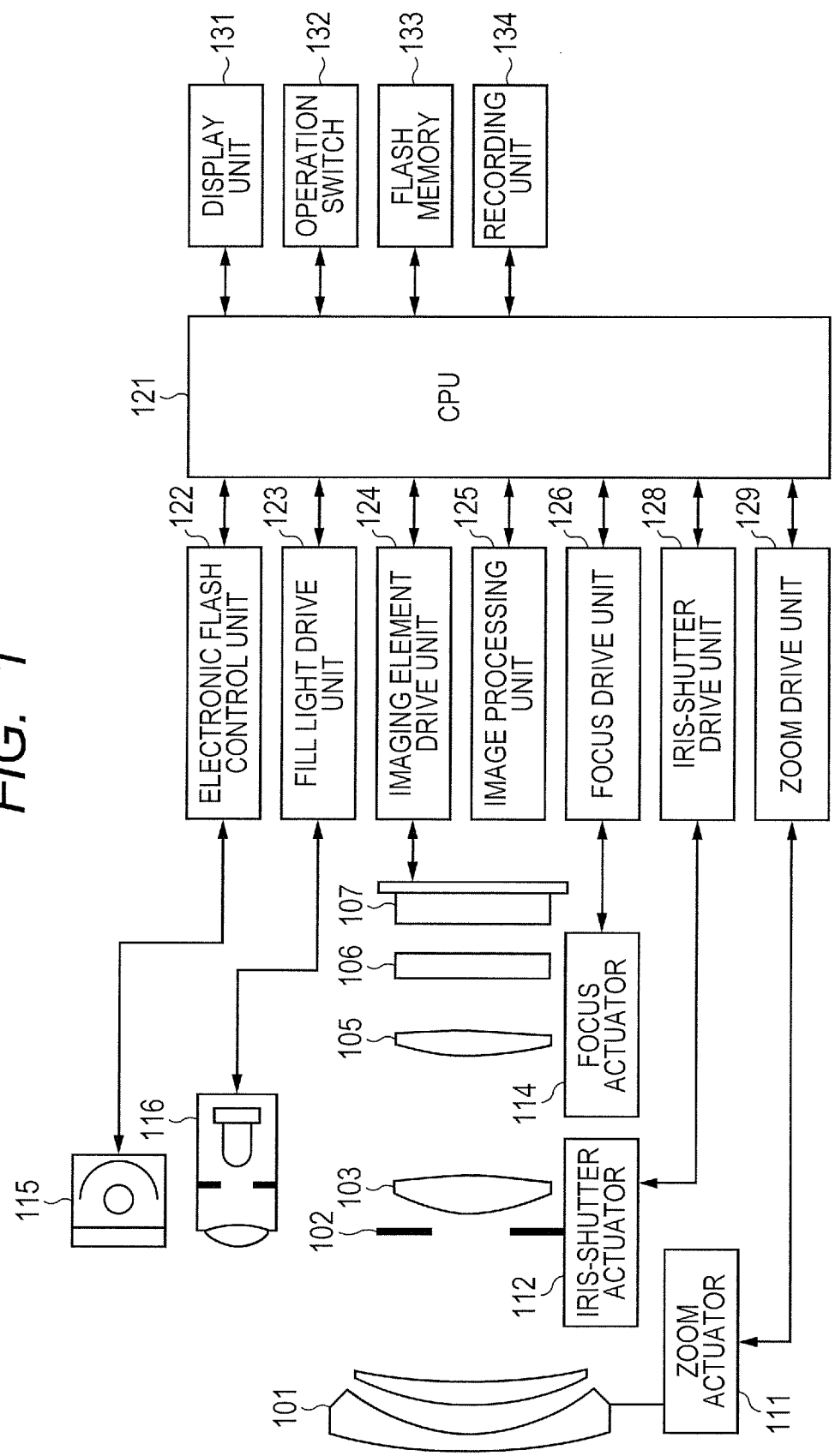
FIG. 1 is a schematic constructional diagram of an imaging apparatus to which a focus adjustment apparatus according to the first embodiment of the invention is applied.

FIG. 1 is a diagram illustrating a construction of a camera serving as an imaging apparatus to which a focus adjustment apparatus according to the first embodiment of the invention is applied. As will be described hereinbelow, the imaging apparatus is an apparatus which has an imaging element having a microlens array serving as pupil division means of an exit pupil of a focusing optical system and can perform a focus adjustment of an imaging plane phase difference method.

In the diagram, a first lens group 101 is arranged at the front end of the focusing optical system for generating an optical image of an object and is held movably backward and forward in an optical axis direction. An iris shutter 102 adjusts a light amount upon photographing by adjusting an aperture diameter and also has a function of an exposure time adjusting shutter at the time of still image photographing. A second lens group 103 is provided. The iris shutter 102 and the second lens group 103 integratedly move backward and forward in the optical axis direction to realize a magnification effect (zoom function) by an interlocking relational manner with the backward and forward moving operation of the first lens group 101.

A third lens group 105 performs a focus adjustment by the backward and forward motion in the optical axis direction. An optical low-pass filter 106 is an optical element for reducing false color and moire of a photographed image. An imaging element 107 is constructed by a two-dimensional CMOS photosensor and its peripheral circuitry unit and is arranged on an imaging plane of the focusing optical system.

In order to realize the magnification effect, a zoom actuator 111 drives the first to third lens groups 101, 103 and 105 movably backward and forward in the optical axis direction by rotating a cam barrel (not shown), thereby performing a magnification operation. An iris-shutter actuator 112 controls an aperture diameter of the iris shutter 102 for adjusting a photographing light amount and controls an exposure time at the time of still image photographing. A focus actuator 114 drives the third lens group 105 movably backward and forward in the optical axis direction in order to perform the focus adjustment.

An electronic flash 115 for illuminating an object upon photographing is provided. Although it is desirable to use a flash illumination device using a xenon tube as a flash 115, another illumination device having an LED which continuously emits light may be used. An AF fill light unit 116 projects an image of a mask having a predetermined aperture pattern onto a field through a light projection lens and improves a focus detection ability to a dark object or a low contrast object.

A CPU 121 is a CPU built in a camera for making various kinds of control of a camera main body and has an arithmetic operation unit, a ROM, a RAM, an A/D converter, a D/A converter, a communication interface unit, and the like. The CPU 121 loads and executes a predetermined program stored in the ROM, thereby driving various kinds of units held in the camera and executing a series of operations such as AF, photographing, image processing, recording, and the like. The CPU 121 is a unit constructing the focus adjustment apparatus of the invention and executes a signal processing for focus adjustment.

An electronic flash control unit 122 controls an on and off state of the illumination unit 115 synchronously with the photographing operation. A fill light drive unit 123 controls an on and off state of the AF fill light unit 116 synchronously with the focus detecting operation. An imaging element drive unit 124 controls the image pickup operation of the imaging element 107, converts an obtained analog image signal into a digital signal, and transmits to the CPU 121. An image processing unit 125 executes processings such as γ conversion, color interpolation, JPEG compression, and the like of the image signal generated by the imaging element 107.

A focus drive unit 126 drives the focus actuator 114 on the basis of a result of the focus detection and drives the third lens group 105 movably backward and forward in the optical axis direction in order to perform the focus adjustment. An iris-shutter drive unit 128 drives the iris-shutter actuator 112, thereby controlling an aperture of the iris shutter 102. A zoom drive unit 129 drives the zoom actuator 111 in accordance with the zoom operation of the photographer.

A display unit 131 such as an LCD or the like displays information regarding a photographing mode of the camera, a preview image before photographing, a post-photographing confirmation image, an in-focus state displaying image at the time of the focus detection, and the like. An operation switch group 132 is constructed by a power switch, a release (photographing trigger) switch, a zoom operation switch, a photographing mode selection switch, and the like. A photographed image is recorded into a detachable flash memory 133 in a predetermined recording format by a recording unit 134.

Imaging Element

Figure 2:
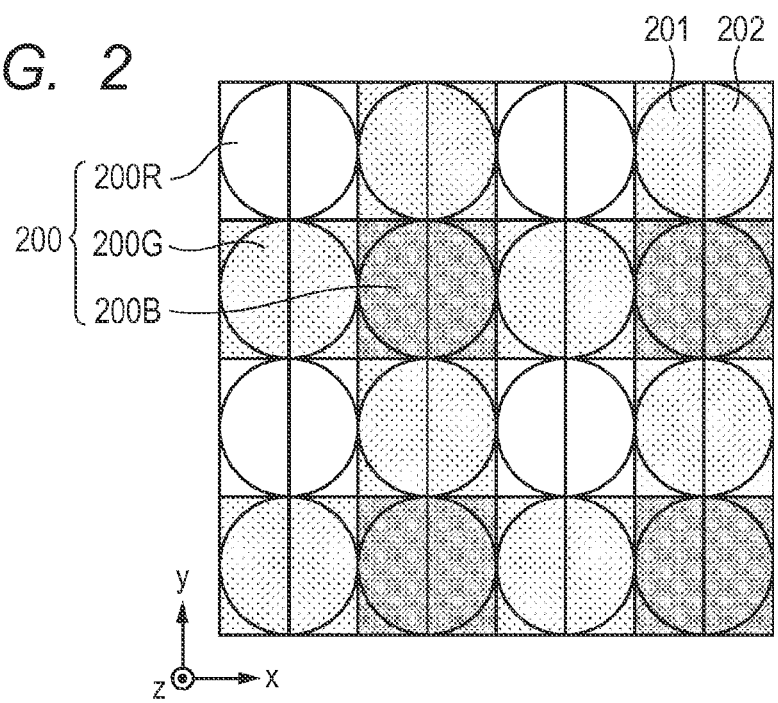
FIG. 2 is a schematic diagram of a pixel array of an imaging element which is used in the imaging apparatus in the first embodiment of the invention.

FIG. 2 illustrates a schematic construction of a pixel array of the imaging element held in the imaging apparatus of the embodiment. In the diagram, a pixel array of a two-dimensional CMOS sensor serving as an imaging element which is used in the present embodiment is illustrated in a range of (4 columns×4 rows) of image pickup pixels (as an array of the focus detection pixels, a range of 8 columns×4 rows).

In the present embodiment, a pixel group 200 of (2 columns×2 rows) illustrated in FIG. 2 is constructed in such a manner that a pixel 200R having a spectrum sensitivity of R (red) is arranged at an upper left position in the diagram, pixels 200G having a spectrum sensitivity of G (green) are arranged at an upper right position and a lower left position, and a pixel 200B having a spectrum sensitivity of B (blue) is arranged at a lower right position, respectively. Further, each pixel is constructed by a first focus detection pixel 201 and a second focus detection pixel 202 arranged in an array of (2 columns×1 row).

In the imaging element 107, a number of image pickup pixels of (4 columns×4 rows) (focus detection pixels of 8 columns×4 rows) illustrated in FIG. 2 are arranged on the imaging plane, thereby enabling the image pickup signal and the focus detection signals to be obtained. The embodiment will be described on the assumption that the imaging element 107 is an element constructed in such a manner that a pitch P of the pixels is equal to 4 μm, the number N of pixels is equal to about 20.75 million pixels (5575 columns in the lateral direction×3725 rows in the vertical direction), a column-direction pitch $P_{AF}$ of the focus detection pixels is equal to 2 μm, and the number $N_{AF}$ of focus detection pixels is equal to about 41.50 million pixels (11150 columns in the lateral direction×3725 rows in the vertical direction), respectively.

Figure 3A:
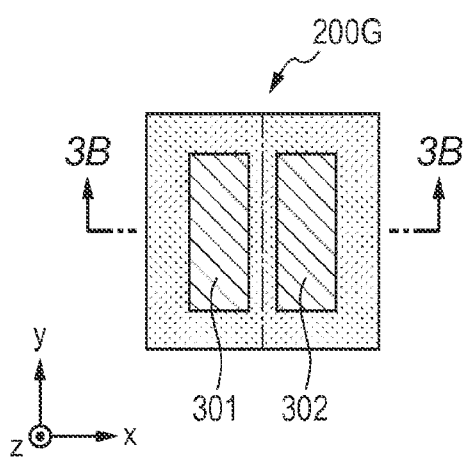
FIGS. 3A and 3B are a schematic plan view and a schematic cross sectional view of a pixel construction of the imaging element which is used in the imaging apparatus in the first embodiment of the invention.
Figure 3B:
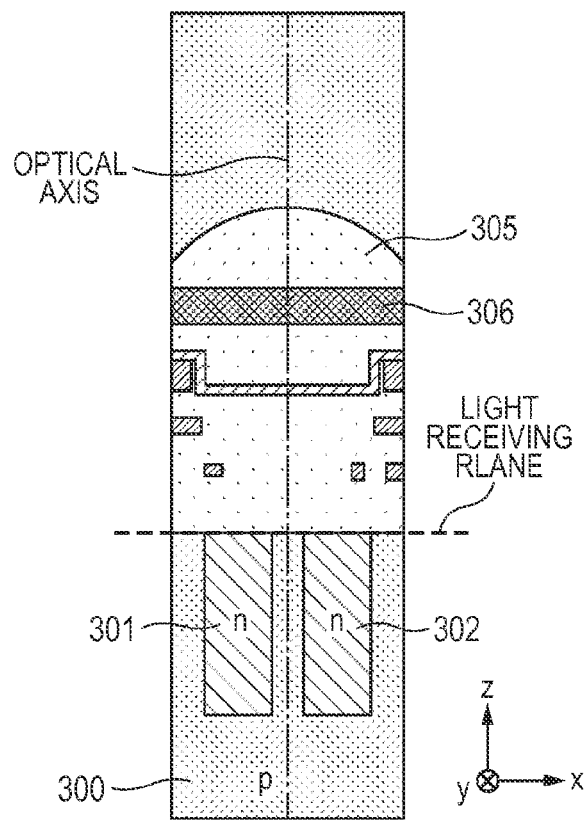

FIG. 3A illustrates a plan view when viewing one pixel 200G of the imaging element illustrated in FIG. 2 from the light receiving plane side (+z side) of the imaging element. FIG. 3B illustrates a cross sectional view when viewing a cross section taken along the line a-a in FIG. 3A from the −y side.

As illustrated in FIGS. 3A and 3B, in the pixel 200G of the present embodiment, a microlens 305 to converge incident light onto the light receiving plane of each pixel is formed. A photoelectric conversion unit 301 and a photoelectric conversion unit 302 each of which is divided into $N_H$ portions (two portions) in the x direction and $N_V$ portions (one portion) in the y direction are formed. The photoelectric conversion unit 301 and the photoelectric conversion unit 302 correspond to the first focus detection pixel 201 and the second focus detection pixel 202, respectively.

Each of the photoelectric conversion units 301 and 302 may be a pin-structure photodiode in which an intrinsic layer is sandwiched between a p-type layer and an n-type layer or may be a pn-junction photodiode in which an intrinsic layer is omitted in accordance with necessity.

In each pixel, a color filter 306 is formed between the microlens 305 and the photoelectric conversion units 301 and 302. A spectrum transmissivity of the color filter may be changed for every subpixel or the color filter may be omitted in accordance with necessity.

The light which entered the pixel 200G illustrated in FIG. 3A is converged by the microlens 305, is separated by the color filter 306, and thereafter, is received by the photoelectric conversion units 301 and 302.

In each of the photoelectric conversion units 301 and 302, an electron and a hole are generated through pair production in accordance with the light reception amount and are separated by a depletion layer. After that, the electron of a negative charge is accumulated in the n-type layer (not shown). The hole is discharged to the outside of the imaging element through the p-type layer 300 connected to a constant voltage source (not shown).

The electrons accumulated in the n-type layer (not shown) of each of the photoelectric conversion units 301 and 302 are transferred to an electric capacitor portion (FD) (not shown) through a transfer gate, are converted into a voltage signal to be output as a pixel signal.

Figure 4:
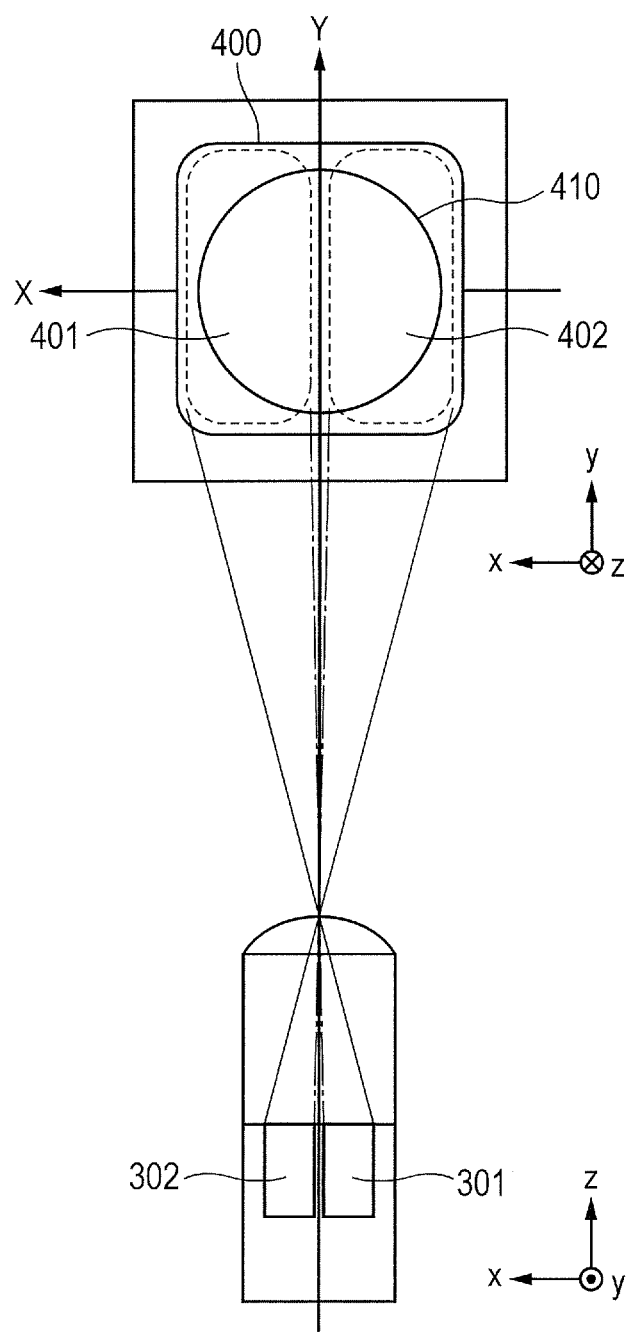
FIG. 4 is a diagram for describing a correspondence between a pixel and pupil division areas of the imaging element which is used in the imaging apparatus in the first embodiment of the invention.

FIG. 4 illustrates an optical correspondence relation between the pixel structure and the pupil division in the first embodiment illustrated in FIGS. 3A and 3B. FIG. 4 illustrates a cross sectional view when viewing a cross section taken along the line a-a of the pixel structure in the present embodiment illustrated in FIG. 3A from the +y side and also illustrates an exit pupil plane of the focusing optical system. In FIG. 4, in order to obtain a correspondence with a coordinate axis of the exit pupil plane, an x axis and a y axis of the cross sectional view are inverted from those in FIGS. 3A and 3B. In FIG. 4, portions similar to those in FIGS. 3A and 3B are denoted with the same reference numerals.

As illustrated in FIG. 4, by the microlens, there is an almost conjugate relation between a first pupil partial area 401 of the first focus detection pixel 201 and the light receiving plane of the photoelectric conversion unit 301 whose center of gravity is deviated in the −x direction. The area 401 shows a pupil area, light passing through which can be received by the first focus detection pixel 201. The center of gravity of the first pupil partial area 401 of the first focus detection pixel 201 is deviated to the +X side on the pupil plane.

By the microlens, there is an almost conjugate relation between a second pupil partial area 402 of the second focus detection pixel 202 and the light receiving plane of the photoelectric conversion unit 302 whose center of gravity is deviated in the +x direction. The area 402 shows a pupil area, light passing through which can be received by the second focus detection pixel 202. The center of gravity of the second pupil partial area 402 of the second focus detection pixel 202 is deviated to the −X side on the pupil plane.

A pupil area 400 is a pupil area where the light can be received by the whole pixel 200G if where the photoelectric conversion unit 301 and the photoelectric conversion unit 302 (the first focus detection pixel 201 and the second focus detection pixel 202) are added.

Figure 5:
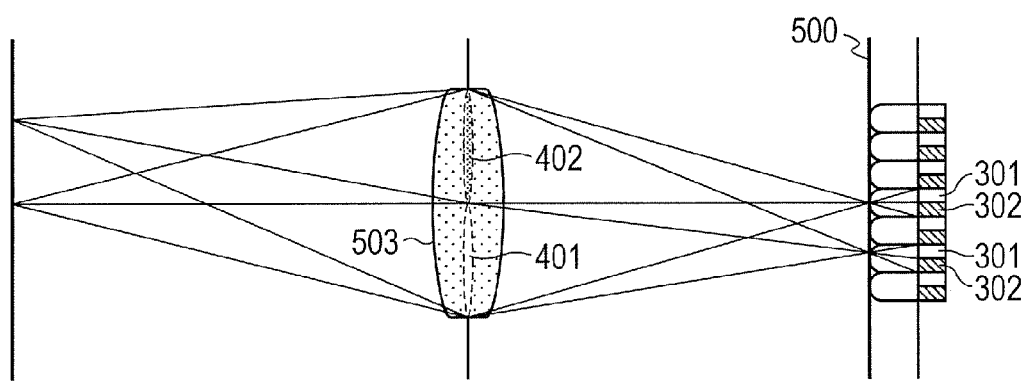
FIG. 5 is a diagram for describing a pupil division in a focusing optical system and the imaging element which are used in the imaging apparatus in the first embodiment of the invention.

FIG. 5 illustrates a schematic diagram of a correspondence relation between the imaging element of the present embodiment and the pupil division which is made by the microlens (pupil division unit). The rays of light which pass through the different pupil partial areas of the first pupil partial area 401 and the second pupil partial area 402 of an exit pupil 503 enter each pixel of the imaging element at different angles, respectively, and are received by the first focus detection pixel 201 and the second focus detection pixel 202 which are divided into (2×1) areas. Although an example in which the pupil area is pupil-divided into two areas in the horizontal direction is shown in the present embodiment, the pupil area may be pupil-divided in the vertical direction in accordance with necessity.

As mentioned above, the imaging element which is used in the present embodiment is an imaging unit which can pick up the images of the object light which passes through the different pupil partial areas of the focusing optical system, respectively. For example, the imaging element has: the first focus detection pixel which picks up the image of the object light passing through the first pupil partial area of the focusing optical system; and the second focus detection pixel which picks up the image of the object light passing through the second pupil partial area of the focusing optical system different from the first pupil partial area. The imaging element may have an array of image pickup pixels which receive a ray of light passing through a pupil area in which the first pupil partial area and the second pupil partial area of the focusing optical system are added. In the imaging element of the present embodiment, each image pickup pixel is constructed by the first focus detection pixel and the second focus detection pixel. However, the image pickup pixel may have a pixel structure distinct from that of the first and second focus detection pixels and the first and second focus detection pixels may be partially arranged in a part of the image pickup pixel array in accordance with necessity.

In the present embodiment, the first focus detection signal is generated by collecting the light reception signals of the first focus detection pixel 201 of each pixel of the imaging element, the second focus detection signal is generated by collecting the light reception signals of the second focus detection pixel 202 of each pixel, and the focus detection is performed. The image pickup signal (picked-up image) of a resolution of the number N of valid pixels is generated by adding the signals of the first focus detection pixel 201 and the second focus detection pixel 202 for every pixel of the imaging element.

Relation Between Defocus Amount and Image Shift Amount

Subsequently, a relation between an image shift amount and a defocus amount of the first focus detection signal and the second focus detection signal which are obtained by the imaging element which is used in the present embodiment will be described.

Figure 6:
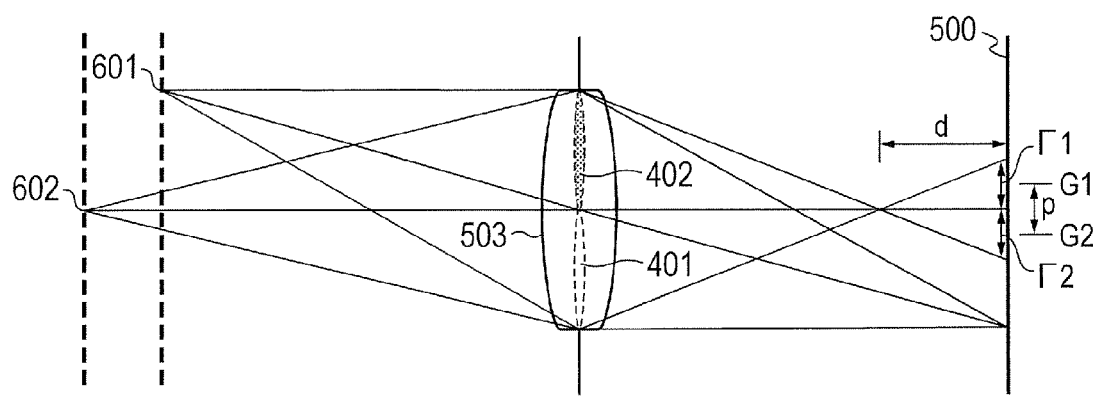
FIG. 6 is a diagram illustrating a relation between a defocus amount and an image shift amount based on a first focus detection signal and a second focus detection signal which are obtained from pixel signals generated by the imaging element which is used in the imaging apparatus in the first embodiment of the invention.

FIG. 6 is a schematic diagram illustrating a relation between the defocus amount of the first and second focus detection signals and the image shift amount between the first and second focus detection signals. The imaging element (not shown) which is used in the present embodiment is arranged on an imaging plane 500. In a manner similar to FIGS. 4 and 5, the exit pupil of the focusing optical system is divided into two areas of the first pupil partial area 401 and the second pupil partial area 402. In FIG. 6, portions similar to those in FIGS. 3A to 5 are designated by the same reference numerals.

A defocus amount d is defined as follows. When a magnitude of a distance from a focusing position of the object to the imaging plane 500 is assumed to be |d|, a state in which a focal plane of the object is on the object side of the imaging plane 500 is set to a negative sign (d<0) and a state in which the focal plane of the object is on the opposite side of the imaging plane 500 to the object is set to a positive sign (d>0). An in-focus state in which the focal plane of the object is on the imaging plane 500 (in-focus position) is set to (d=0). In FIG. 6, an example in which an object 601 is in the in-focus state (d=0) is shown and an example in which an object 602 is in the state (d<0) in which the focal plane of the object is on the object side of the imaging plane is shown. The state (d<0) in which the focal plane of the object is on the object side of the imaging plane and the state (d>0) in which the focal plane of the object is on the opposite side of the imaging plane 500 to the object are collectively referred to as a defocus state (|d|>0).

In the state (d<0) in which the focal plane of the object is on the object side of the imaging plane, the object light which passes through the first pupil partial area 401 (second pupil partial area 402) in the ray of light from the object 602 is converged once and thereafter spreads to an extent of a width Γ1 (Γ2) at a center G1 (G2) of gravity of the ray of light, so that the object light forms a blurred image on the imaging plane 500. The light of the blurred image is received by the first focus detection pixel 201 (second focus detection pixel 202) constructing each pixel arranged in the imaging element, so that the first focus detection signal (second focus detection signal) is generated. Therefore, the first focus detection signal (second focus detection signal) is recorded as such an object image that the object 602 is blurred to an extent of the width Γ1 (Γ2) at the center G1 (G2) of gravity on the imaging plane 500. In association with an increase in magnitude |d| of the defocus amount d, the blurring width Γ1 (Γ2) of the object image increases almost in proportion to it. Similarly, in association with an increase in magnitude |d| of the defocus amount d, a magnitude |p| of an image shift amount p of the object image between the first and second focus detection signals (=difference G1−G2 between the positions of the centers of gravity of the rays of light) also increases almost in proportion to it. This is also true of the state (d>0) in which the focal plane of the object is on the opposite side of the imaging plane 500 to the object although the image shift direction of the object image between the first and second focus detection signals is opposite to that in the state in which the focal plane of the object is on the object side of the imaging plane.

Therefore, in the invention, in association with the increase in magnitude of the defocus amount of the first and second focus detection signals or in association with an increase in magnitude of a defocus amount of an image pickup signal in which the first and second focus detection signals are added, a magnitude of the image shift amount between the first and second focus detection signals increases.

In the present embodiment, the focus adjustment of the phase difference method is performed by using the relation between the defocus amount and the image shift amount of the first and second focus detection signals.

In the focus adjustment of the phase difference method, the first and second focus detection signals are relatively shifted, a correlation amount showing a degree of agreement between the signals is calculated, and the image shift amount is detected from such a shift amount that the correlation (degree of agreement between the signals) is improved. From such a relation that in association with an increase in magnitude of the defocus amount of the image pickup signals, the magnitude of the image shift amount between the first and second focus detection signals increases, the image shift amount is converted into the defocus amount, thereby performing the focus detection.

Frame Vignetting

In the present embodiment, since the pupil division is attained with the microlens of the imaging element, the pupil division area is not a distinct area due to an influence of diffraction but appears light receiving ratio distribution, and a frame vignetting occurs by a lens frame or iris frame of the photographing lens.

In FIG. 4, while a pupil distance to the exit pupil plane is equal to about tens of mm, a diameter of the microlens is equal to a few μm. Therefore, an iris value of the microlens is equal to tens of thousands and a diffraction blurring on the level of tens of mm occurs. Thus, the image on the light receiving plane of the photoelectric conversion unit is not a distinct pupil area or pupil partial area but appears pupil intensity distribution (angle-of-incidence distribution of a light receiving ratio).

Figure 7:
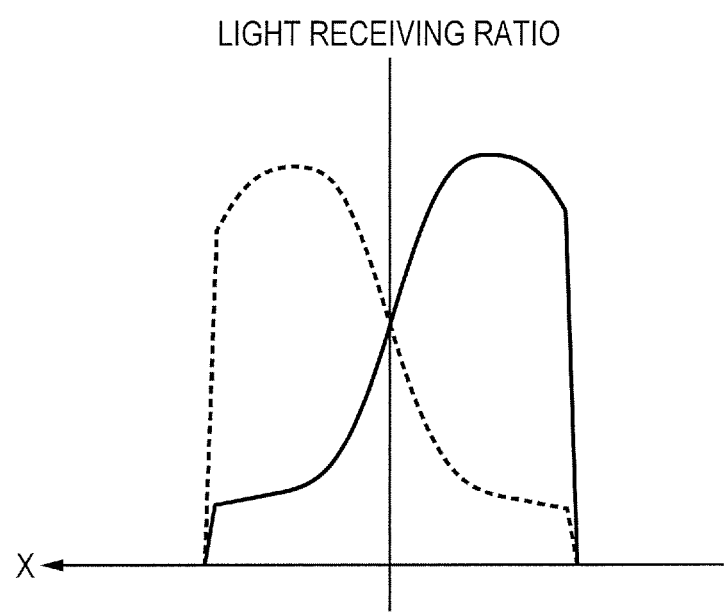
FIG. 7 is a diagram illustrating an example of pupil intensity distribution in a pixel in the imaging element which is used in the imaging apparatus in the first embodiment of the invention.

FIG. 7 (broken line) illustrates an example of one-dimensional pupil intensity distribution along an X axis of the first focus detection pixel to which the first pupil partial area 401 of the first focus detection pixel is projected for the X axis of the exit pupil plane of the focusing optical system in FIG.

4. FIG. 7 (solid line) also illustrates an example of one-dimensional pupil intensity distribution along an X axis of the second focus detection pixel to which the second pupil partial area 402 of the second focus detection pixel is projected for the X axis of the exit pupil plane of the focusing optical system in FIG. 4. In FIG. 7, an axis of abscissa indicates the X axis of the exit pupil plane of the focusing optical system and an axis of ordinate indicates the light receiving ratio.

On the −X side of the pupil intensity distribution (broken line) of the first focus detection pixel in FIG. 7, a boundary of the pupil partial area is blurred by an influence of the diffraction due to the pupil division by the microlens and becomes a gentle curve. On the other hand, on the +X side as an opposite side, since a vignetting occurs due to the exit pupil which is specified by the lens frame or iris frame of the focusing optical system, the pupil intensity distribution becomes a steep curve. The pupil intensity distribution (solid line) of the second focus detection pixel in FIG. 7 has such a shape that the positive and negative values of the X axis of the pupil intensity distribution (broken line) of the first focus detection pixel are inverted. Therefore, the pupil intensity distribution of the first focus detection pixel and the pupil intensity distribution of the second focus detection pixel do not have the same shape, and a degree of agreement in the case where they are moved (shifted) in parallel so as to be overlaid decreases.

Images obtained by scale-converting the one-dimensional pupil intensity distribution shapes of the first and second focus detection pixels in FIG. 7 in accordance with the pupil distance and the defocus amount of the focusing optical system are line images of the first and second focus detection signals, respectively. Therefore, in the defocus state, the line image of the first focus detection signal and the line image of the second focus detection signal do not have the same shape, and an agreement of forms between the first and second focus detection signals deteriorates. In the in-focus state, the line image of the first focus detection signal and the line image of the second focus detection signal together approach a delta function, and the first focus detection signal and the second focus detection signal have almost the same shape.

Figure 8A:
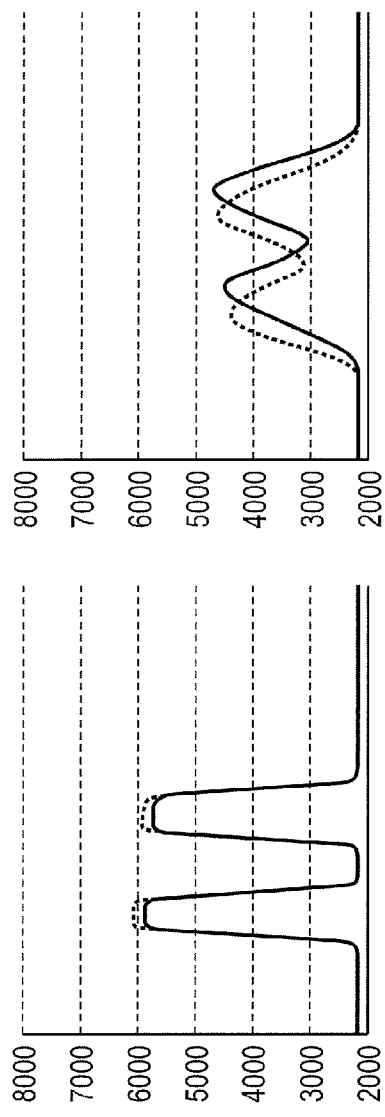
FIGS. 8A, 8B, 8C, 8D, 8E and 8F are diagrams illustrating examples of the first focus detection signal and the second focus detection signal which are obtained from the pixel signals generated by the imaging element which is used in the imaging apparatus in the first embodiment of the invention.
Figure 8B:
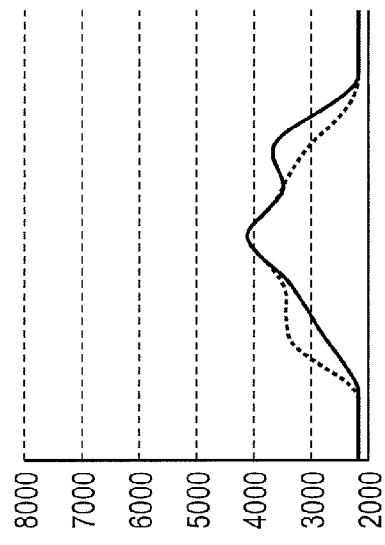
Figure 8C:
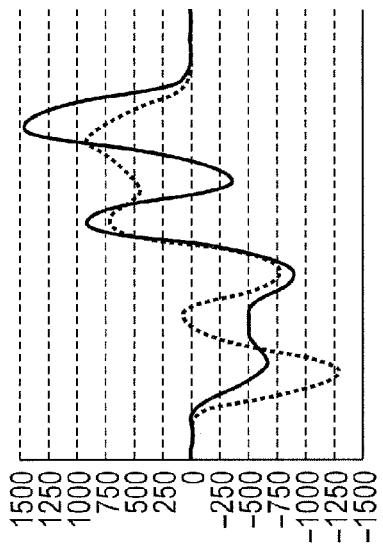

FIG. 8A illustrates an example in the in-focus state of the first focus detection signal (broken line) and the second focus detection signal (solid line) of the object of two lines in the present embodiment. FIG. 8B illustrates an example in a middle defocus state. FIG. 8C illustrates an example in a large defocus state. It will be understood that as the image approaches the large defocus state from the in-focus state, the image shift amount increases while the image is being blurred.

In the focus detection of the phase difference method, ordinarily, in order to improve a focus detection accuracy by raising the correlation (degree of agreement between the signals), a processing of the differential filter for cutting DC components of the first and second focus detection signals and extracting edges is executed and, thereafter, a correlation amount is calculated. The differential filter is constructed with values in which filter components are positive and negative values as shown in examples of {1, 2, 0, −2, −1} or {1, 4, 4, 4, 0, −4, −4, −4, −1}.

Figure 8D:
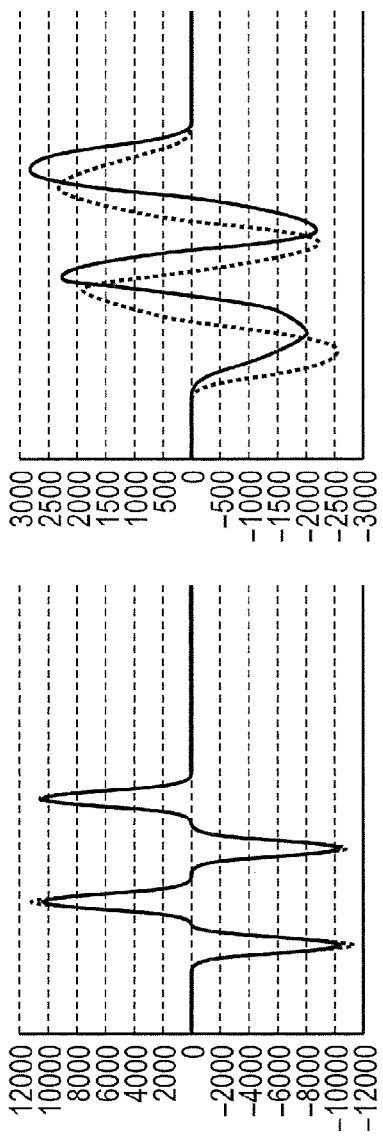
Figure 8E:
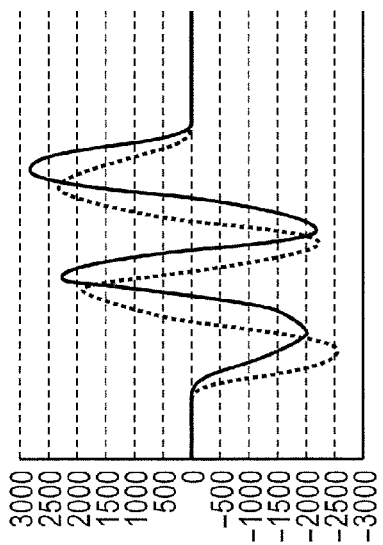

FIG. 8D illustrates an example in which the differential filter processing is executed to the first focus detection signal (broken line) and the second focus detection signal (solid line) in the in-focus state in FIG. 8A. FIG. 8E illustrates an example in which the differential filter processing is executed to the first focus detection signal (broken line) and the second focus detection signal (solid line) in the middle defocus state in FIG. 8B.

However, if the differential filter processing for performing the edge extraction is executed to the first and second focus detection signals in which the agreement of forms deteriorated due to the frame vignetting, there is a case where a distortion of the shapes of the first and second focus detection signals is emphasized in dependence on photographing conditions. Thus, there is a case where an erroneous in-focus detection (false in-focus detection) occurs.

Figure 8F:
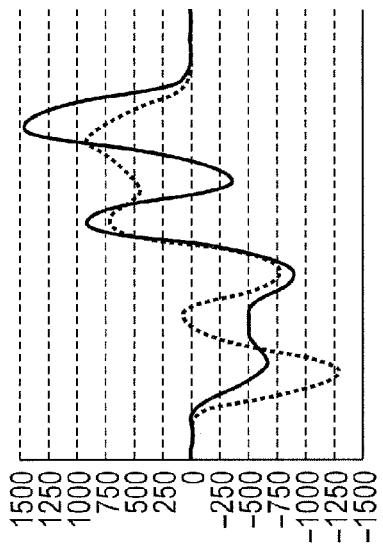

FIG. 8F illustrates an example in which the differential filter processing is executed to the first focus detection signal (broken line) and the second focus detection signal (solid line) in the large defocus state in FIG. 8C. FIG. 8F illustrates an example of the signals in the case where by executing the differential filter processing, a distortion of the shapes of the first and second focus detection signals is emphasized and a false in-focus detection occurs. FIG. 8F illustrates an example in the case where in spite of a fact that the defocus amount of FIG. 8F is larger than the defocus amount of FIG. 8E, the distortion of the shapes of the first and second focus detection signals is emphasized, so that the defocus amount of FIG. 8F is calculated as a small value and the false in-focus detection occurs.

If the false in-focus detection occurs by the differential filter processing as illustrated in FIG. 8F, by calculating the defocus amount by arithmetically operating the correlation amount without executing the differential filter processing as illustrated in FIG. 8C, whether or not the in-focus state also occurs or the false in-focus detection occurs can be determined.

In the case where the differential filter processing is not executed, a processing of an additive filter for suppressing high frequency noise components of the first and second focus detection signals is executed and, thereafter, a correlation amount is calculated. The additive filter is constructed by values in which all of filter components are non-negative (positive or 0) as shown in examples of {1, 1} or {1, 2, 1} or by values in which all of filter components are non-positive (negative or 0).

Focus Detection

In the invention, when the differential filter processing is executed to the first and second focus detection signals, the first correlation amount is calculated, and the focus detection is performed, the additive filter processing is executed to the first and second focus detection signals, the second correlation amount is calculated, and the determination about the false in-focus detection is made. Thus, the false in-focus detection in the focus detection based on the first correlation amount is suppressed and the focus detection accuracy can be improved.

FIG. 9 illustrates a flowchart for the focus adjustment operation of the present embodiment. The operation of FIG. 9 is executed by the imaging element 107, image processing unit 125, and CPU 121 of the imaging apparatus in the embodiment. Particularly, the functions as a focus detection signal generation unit, a first correlation amount generation unit, a second correlation amount generation unit, a first focus detection unit, and an evaluation value generation unit of the focus adjustment apparatus in the embodiment are executed by the image processing unit 125 and the CPU 121.

In step S100, the first focus detection signal and the second focus detection signal are generated by the focus detection signal generation unit. The generating operation of the first and second focus detection signals in step S100 will be described with reference to a flowchart illustrated in FIG. 10.

In step S101, a focus detection area adapted to perform the focus adjustment is set from the valid pixel areas of the imaging element. By the focus detection signal generation unit, the first focus detection signal is generated from the pixel signal of the first focus detection pixel of the focus detection area and the second focus detection signal is generated from the pixel signal of the second focus detection pixel of the focus detection area.

In step S102, a 3-pixel addition processing is executed in the column direction to each of the first and second focus detection signals in order to suppress the signal data amount and, further, a Bayer (RGB) addition processing is executed in order to convert an RGB signal into a luminance signal Y. Those two addition processings are collectively referred to as a first pixel addition processing.

In step S103, a shading correction processing (optical correction processing) is executed to each of the first and second focus detection signals in accordance with an image height of the focus detection area, an F value of the photographing lens (focusing optical system), and the exit pupil distance.

Figure 11:
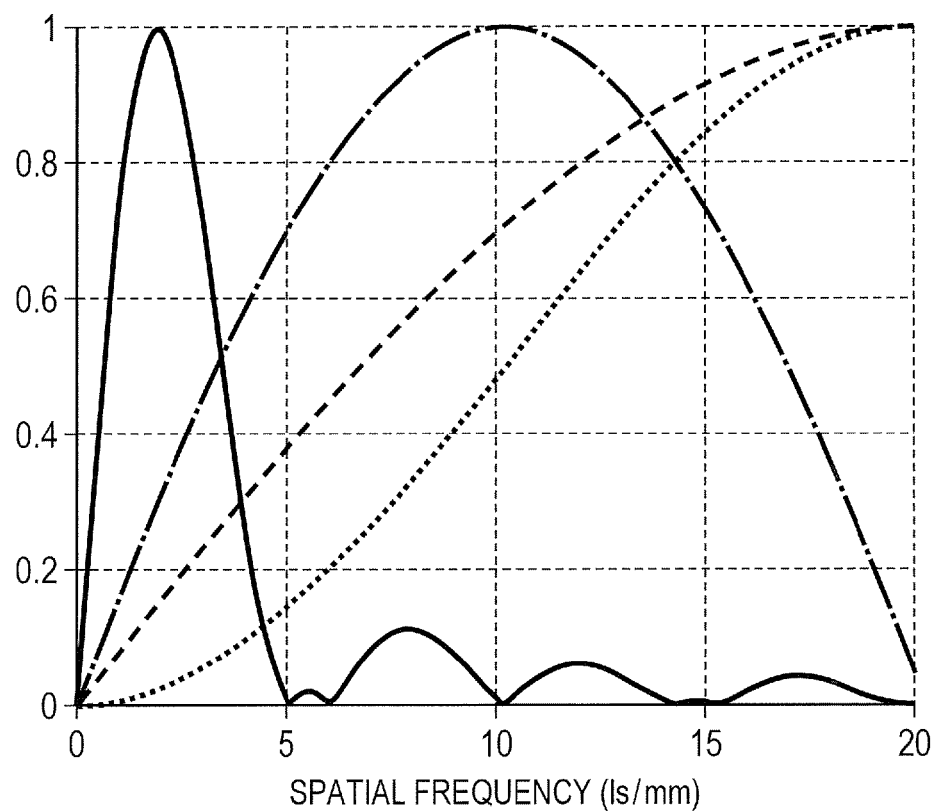
FIG. 11 is a diagram illustrating an example of a frequency band of a differential filter in the invention.

In step S011 in FIG. 9, a differential filter processing having positive and negative components for performing the edge extraction by cutting a DC component is executed to the first and second focus detection signals. An example of a passband of the differential filter in the embodiment 1 is illustrated by a solid line in FIG. 11.

In step S012, a shift processing for relatively shifting the first and second focus detection signals obtained after the differential filter processing in the pupil dividing direction is executed and a first correlation amount showing a degree of agreement between the signals is calculated by a first correlation amount calculation unit.

It is now assumed that a kth first focus detection signal is denoted as A(k), a kth second focus detection signal is denoted as B(k), and a range of the number k corresponding to the focus detection area is denoted as W. Assuming that a shift amount by the shift processing is denoted as s and a shift range of the shift amount s is denoted as Γ, a first correlation amount COR is calculated by the following equation (1).

$$COR(s) = \sum_{k \in W} |A(k) - B(k-s)|,$$
$$s \in \Gamma$$
(1)

By the shift processing of the shift amount s, a (k−s)th second focus detection signal B(k−s) is subtracted from the kth first focus detection signal A(k), thereby generating a shift subtraction signal. A sum of absolute values of the generated shift subtraction signals is obtained with respect to the number k within the range W corresponding to the focus detection area and a first correlation amount COR(s) is calculated. The first correlation amount calculated for every row may be added for every shift amount with respect to a plurality of rows in accordance with necessity.

In step S013, a shift amount of a real number in which the first correlation amount is equal to a minimum value is calculated from the first correlation amount by a subpixel arithmetic operation by the first focus detection unit and is set to a first image shift amount p1. A first defocus amount (Def1) is calculated by multiplying the first image shift amount p1 by a conversion coefficient K according to the image height of the focus detection area, the F value of the photographing lens (focusing optical system), and the exit pupil distance.

In the present embodiment, by executing the filter processing to the first and second focus detection signals by using the differential filter having the positive and negative components, the first correlation amount is calculated and the first defocus amount is detected from the first correlation amount.

In step S014 in FIG. 9, whether or not an absolute value of the first defocus amount (Def1) is larger than a first predetermined value is discriminated. If it is larger than the first predetermined value, it is determined that the focus state of the focusing optical system is the defocus state, and step S200 follows. If the absolute value of the first defocus amount (Def1) is equal to or smaller than the first predetermined value, it is determined that there is a possibility that the focus state of the focusing optical system is the in-focus state (neighborhood of the in-focus position). In step S100, the first and second focus detection signals are generated. After that, in order to discriminate whether or not the false in-focus detection occurs, step S021 follows.

In step S021, an additive filter processing having only the non-negative component for suppressing the high frequency noise component or only the non-positive component is executed to the first and second focus detection signals.

In step S022, a shift processing for relatively shifting the first and second focus detection signals obtained after the additive filter processing in the pupil dividing direction is executed and a second correlation amount showing a degree of agreement between the signals is calculated by the second correlation amount calculation unit. The calculation of the second correlation amount is executed in a manner similar to the calculation of the first correlation amount except for a point that the additive filter processing instead of the differential filter processing is executed to the first and second focus detection signals.

In step S023, an evaluation value (Obj) is calculated from the second correlation amount by the evaluation value calculation unit. In the present embodiment, a shift amount of a real number in which the second correlation amount is equal to a minimum value is calculated from the second correlation amount by a subpixel arithmetic operation and a second image shift amount p2 is calculated. Subsequently, a second defocus amount (Def2) is calculated by multiplying the calculated second image shift amount p2 by the conversion coefficient K according to the image height of the focus detection area, the F value of the photographing lens (focusing optical system), and the exit pupil distance. It is assumed that an absolute value of the second defocus amount (Def2) is used as the evaluation value (Obj).

A minimum value (degree of image agreement) of the second correlation amount calculated by the subpixel arithmetic operation from the second correlation amount may be set to the evaluation value (Obj) in accordance with necessity. The larger a degree of shape agreement between the first and second focus detection signals is, the smaller the minimum value (degree of image agreement) of the second correlation amount is. A reciprocal number of an inclination of the second correlation amount (first order differential of the second correlation amount) at the position of the calculated second image shift amount p2 may be set to the evaluation value (Obj) in accordance with necessity.

As mentioned above, in the present embodiment, by executing the filter processing to the first and second focus detection signals by using the additive second filter having only the non-negative component or the non-positive component, the second correlation amount is calculated and the evaluation value is calculated from the second correlation amount.

In step S024 in FIG. 9, whether or not the evaluation value (Obj) is larger than a second predetermined value is discriminated. If it is larger than the second predetermined value, it is evaluated that the focus state of the focusing optical system is not the neighborhood of the in-focus position but is the defocus state, and step S200 follows. In step S200, the lenses of the focusing optical system are driven in accordance with the first defocus amount (Def1). In step S100, the first and second focus detection signals are generated again. After that, step S011 follows.

In step S024 in FIG. 9, if the evaluation value (Obj) is equal to or smaller than the second predetermined value, it is evaluated that the focus state of the focusing optical system is the in-focus state (neighborhood of the in-focus position). The focus adjustment operation is finished.

In the invention, if the absolute value of the first defocus amount calculated from the first correlation amount is equal to or smaller than the first predetermined value, a discrimination about the false in-focus detection of the first defocus amount is made on the basis of the evaluation value calculated from the second correlation amount.

If contrasts of the first and second focus detection signals are low, there is a case where the reliability of the evaluation value calculated from the second correlation amount containing the DC component deteriorates. Therefore, when the contrasts of the first and second focus detection signals are low, a condition branch may be performed so as not to make a discrimination about the false in-focus detection of the first defocus amount based on the evaluation value calculated from the second correlation amount in accordance with necessity.

As a contrast evaluation value of the first focus detection signal $\{A(k), k \in W\}$, a difference between the maximum value and the minimum value of the pixel signal, a sum $\Sigma|A(k+1)-A(k)|$ of the absolute values of the adjacent differences, a square sum $\Sigma|A(k+1)-A(k)|^2$ of the absolute values of the adjacent differences, or the like can be used. This is true of the second focus detection signal. When the contrast evaluation values of the first and second focus detection signals are equal to or smaller than a third predetermined value, it is possible to decide that the contrasts are low.

By the foregoing construction, in the focus adjustment of the imaging plane phase difference method, the false in-focus detection is suppressed and the focus detection accuracy can be improved.

Embodiment 2

Figure 12:
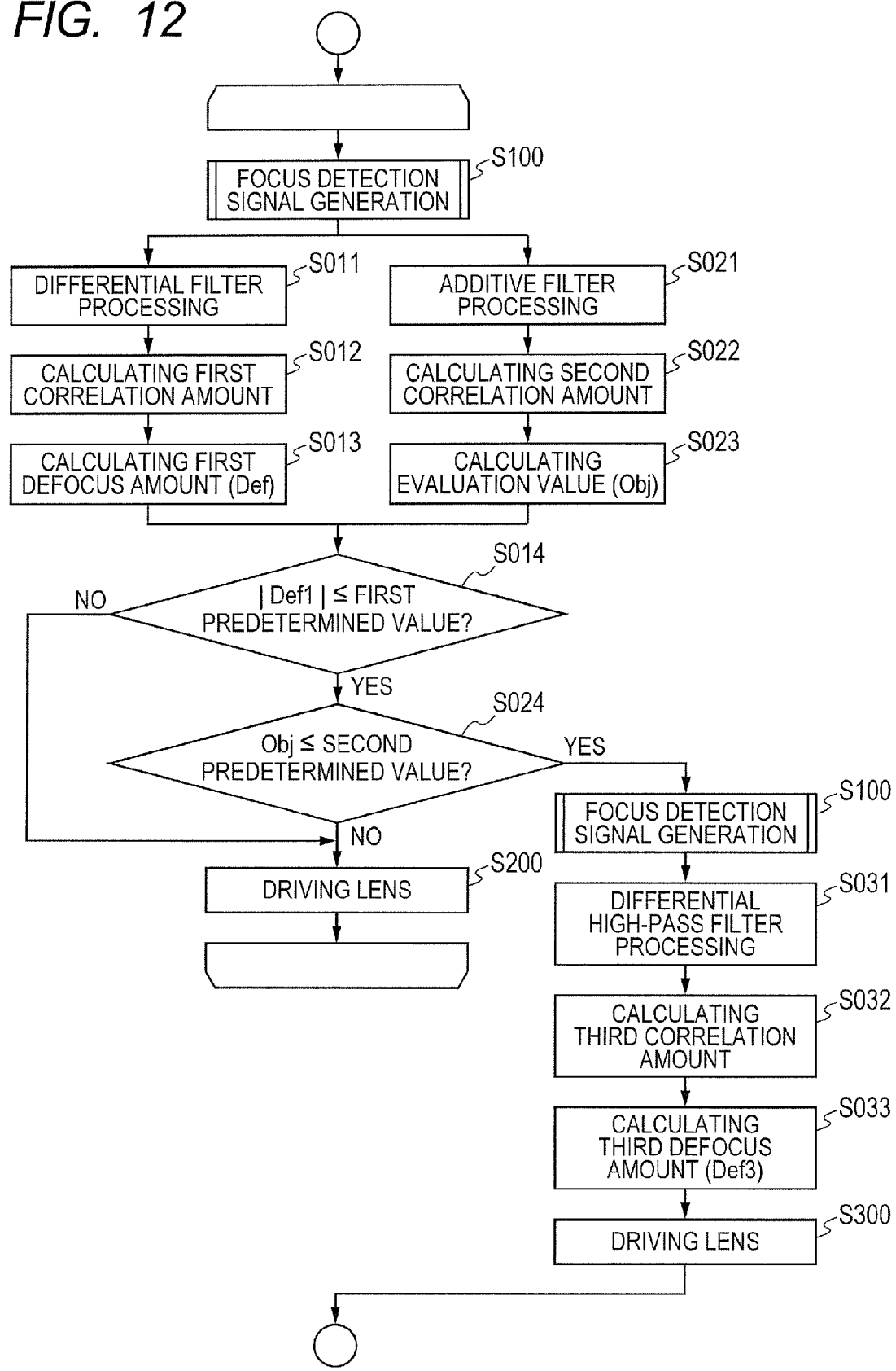
FIG. 12 is a diagram illustrating a flowchart for the focus adjustment operation according to the second embodiment of the invention.

Subsequently, the focus adjustment operation of the second embodiment of the invention will be described with reference to a flowchart illustrated in FIG. 12. The embodiment relates to an example in which the calculation of the first correlation amount in which the differential filter processing is executed to the first and second focus detection signals and the calculation of the second correlation amount in which the additive filter processing is executed are processed in parallel and the focus adjustment is performed at a high speed. Since the imaging apparatus is similar to that in the first embodiment, its description is omitted here. In FIG. 12, portions similar to those in FIG. 9 are denoted with the same reference numerals.

In step S100 in FIG. 12, the first and second focus detection signals are generated by the focus detection signal generation unit and steps S011 and S021 follow.

In steps S011 to S013 in FIG. 12, in a manner similar to the first embodiment, the filter processing is executed to the first and second focus detection signals by using the differential first filter having the positive and negative components, and the first correlation amount is calculated. The first defocus amount (Def1) is detected from the first correlation amount.

In steps S021 to S023 in FIG. 12, in a manner similar to the first embodiment, the filter processing is executed to the first and second focus detection signals by using the additive second filter having only the non-negative component or only the non-positive component. The second correlation amount is calculated from the processed focus detection signals and the evaluation value (Obj) is calculated from the second correlation amount.

In step S014 in FIG. 12, whether or not the absolute value of the first defocus amount (Def1) is larger than the first predetermined value is discriminated. If it is larger than the first predetermined value, it is determined that the focus state of the focusing optical system is the defocus state, and step S200 follows. If the absolute value of the first defocus amount (Def1) is equal to or smaller than the first predetermined value, it is determined that there is a possibility that the focus state of the focusing optical system is the in-focus state (neighborhood of the in-focus position), and step S024 follows.

In step S024 in FIG. 12, if the evaluation value (Obj) is larger than the second predetermined value, it is evaluated that the focus state of the focusing optical system is not the neighborhood of the in-focus position but is the defocus state, and step S200 follows. In step S200, the lenses of the focusing optical system are driven in accordance with the first defocus amount (Def1). In step S100, the first and second focus detection signals are again generated and, thereafter, steps S011 and S021 follow.

In step S024 in FIG. 12, if the evaluation value (Obj) is equal to or smaller than the second predetermined value, it is evaluated that the focus state of the focusing optical system is the in-focus state (neighborhood of the in-focus position). In step S100, the first and second focus detection signals are generated and, thereafter, step S031 follows.

In step S031, since the focus state is the neighborhood of the in-focus position of the focusing optical system, the differential high-pass filter processing having a passband of the higher frequency than that of the differential filter is executed to the first and second focus detection signals. Examples of the passband of the differential high-pass filter in the present embodiment are illustrated by an alternate long and short dash line, a broken line, and a dotted line in FIG. 11.

In step S032, a shift processing for relatively shifting the first and second focus detection signals obtained after the differential high-pass filter processing in the pupil dividing direction is executed and a third correlation amount showing a degree of agreement between the signals is calculated by a third correlation amount calculation unit. The calculation of the third correlation amount is similar to the calculation of the first correlation amount except for a point that the differential high-pass filter processing instead of the differential filter processing is executed to the first and second focus detection signals.

In step S033, a shift amount of a real number in which the third correlation amount is equal to a minimum value is calculated from the third correlation amount by a subpixel arithmetic operation by the first focus detection unit and is set to a third image shift amount p3. A third defocus amount (Def3) is calculated by multiplying the third image shift amount p3 by the conversion coefficient K according to the image height of the focus detection area, the F value of the photographing lens (focusing optical system), and the exit pupil distance.

In step S300 in FIG. 12, the lenses of the focusing optical system are driven in accordance with the third defocus amount (Def3) and the focus adjustment operation is finished.

Also by the foregoing second embodiment, in the focus adjustment of the imaging plane phase difference method, the false in-focus detection is suppressed, the focus detection accuracy can be improved, and further, the speed of the focus adjustment can be also raised.

Figure 10:
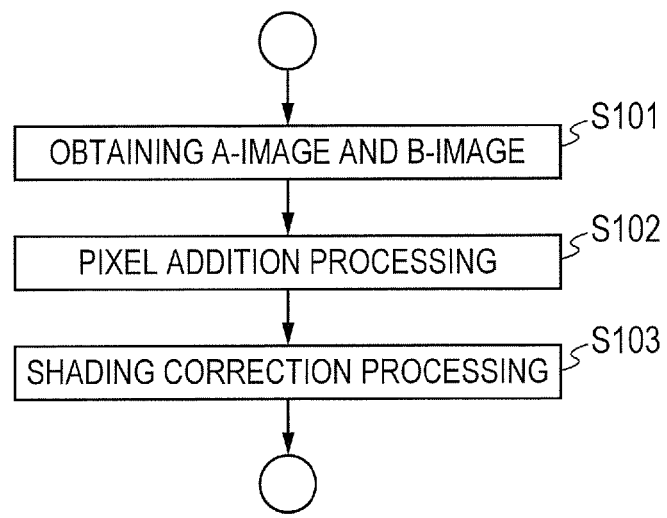
FIG. 10 is a diagram illustrating a flowchart for the focus detection signal generating operation in the focus detection apparatus according to the first embodiment of the invention.

In the foregoing embodiments, the functions of the processings shown in FIGS. 9, 10, and 12 are realized by a method whereby the CPU 121 reads out the program for realizing the functions of the processings from the memory and executes it.

Other Embodiments

Embodiments of the present invention can also be realized by a computer of a system or apparatus that reads out and executes computer-executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer-executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer-executable instructions may be provided to the computer, for example, from a network or the storage medium. The storage medium may include, for example, one or more of a hard disk, a random access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-098529, filed on May 8, 2013, which is hereby incorporated by reference herein in its entirety.

What is claimed is:

1. A focus adjustment apparatus comprising:
an imaging unit configured to output a pair of focus detection signals by photoelectrically converting rays of light which pass through different pupil areas of a focusing optical system;
a focus detection unit configured to detect a first defocus amount by executing a first filter processing to the pair of focus detection signals;
a determination unit configured to determine a focus state on the basis of the first defocus amount;
an evaluation value generation unit configured to generate an evaluation value of the first defocus amount by executing a second filter processing to the pair of focus detection signals in accordance with a result of the determination about the focus state; and
a control unit configured to evaluate the result of the determination about the focus state on the basis of the evaluation value and control a focus adjustment in accordance with a result of the evaluation.

2. An apparatus according to claim 1, wherein the first filter processing is a differential filter processing.

3. An apparatus according to claim 1, wherein the second filter processing is an additive filter processing.

4. An apparatus according to claim 1, wherein the determination unit determines whether or not the first defocus amount is larger than a first predetermined value, and determines that the focus state is in an in-focus state when the first defocus amount is equal to or smaller than the first predetermined value,
wherein the evaluation value generation unit generates the evaluation value in the case where the determination unit determines that the focus state is in the in-focus state, and
wherein the control unit determines whether or not the evaluation value is larger than a second predetermined value, and evaluates that the result of the determination showing that the focus state is in the in-focus state is valid in a case where the evaluation value is equal to or smaller than the second predetermined value.

5. An apparatus according to claim 1, wherein the evaluation value generation unit executes the second filter processing to the pair of focus detection signals, detects a second defocus amount, and sets the second defocus amount into the evaluation value.

6. An apparatus according to claim 1, wherein the detection of the first defocus amount by the focus detection unit and the generation of the evaluation value by the evaluation value generation unit are performed in parallel.

7. An apparatus according to claim 1, wherein if it is evaluated that the result of the determination showing that the focus state is in the in-focus state is valid, the control unit controls the focus detection unit and executes a third filter processing to the focus detection signals, thereby detecting a third defocus amount and performing the focus adjustment on the basis of the third defocus amount.

8. An apparatus according to claim 7, wherein the third filter processing is a differential high-pass filter processing.

9. An apparatus according to claim 1, wherein the evaluation value generation unit generates the evaluation value by using a correlation amount generated by executing the second filter processing to the pair of focus detection signals.

10. An apparatus according to claim 1, wherein the imaging unit is arranged to set a focus detection area in the captured image by the imaging unit and generates the focus detection signals by using a signal of the focus detection area.

11. An apparatus according to claim 1, wherein the control unit generates a contrast evaluation value by using the pair of focus detection signals and does not make the evaluation of the result of the determination about the focus state in a case where the contrast evaluation value of at least one of the pair of focus detection signals is equal to or smaller than a third predetermined value.

12. An imaging apparatus comprising:
a focusing optical system configured to form an optical image of an object;
the focus adjustment apparatus according to claim 1; and a drive unit configured to drive the focusing optical system in accordance with the focus adjustment of the object which is performed by the focus adjustment apparatus.

13. An apparatus according to claim 1, wherein the imaging unit includes a plurality of pixels, each pixel including a plurality of photoelectric conversion elements corresponding to a microlens, and
wherein the plurality of photoelectric conversion elements within each pixel includes at least a first photoelectric conversion element for receiving a ray of light which passes through a first pupil partial area of the focusing optical system so that the ray is pupil-divided and a second photoelectric conversion element for receiving a ray of light which passes through a second pupil partial area different from the first pupil partial area so that the ray is pupil-divided.

14. An apparatus according to claim 1, wherein the imaging unit includes a plurality of pixels, and
wherein the plurality of pixels includes a first pixel having a first photoelectric conversion element for receiving a ray of light which passes through a first pupil partial area of the focusing optical system so that the ray is pupil-divided and a second pixel having a second photoelectric conversion element for receiving a ray of light which passes through a second pupil partial area different from the first pupil partial area so that the ray is pupil-divided.

15. A focus adjustment apparatus comprising:
an imaging unit which includes a plurality of photoelectric conversion elements corresponding to one microlens, wherein a plurality of the microlenses are two-dimensionally arranged;
a focus detection unit configured to detect a first defocus amount by executing a first filter processing to a pair of focus detection signals which are output from the imaging unit;
a determination unit configured to determine a focus state on the basis of the first defocus amount;
an evaluation value generation unit configured to generate an evaluation value of the first defocus amount by executing a second filter processing to the pair of focus detection signals in accordance with a result of the determination about the focus state; and
a control unit configured to evaluate the result of the determination about the focus state on the basis of the evaluation value and control a focus adjustment in accordance with a result of the evaluation.

16. A control method of a focus adjustment apparatus for performing a focus adjustment by using an output signal which is output from an imaging unit configured to output a pair of focus detection signals by photoelectrically converting rays of light which pass through different pupil areas of a focusing optical system, comprising:
a focus detection step of detecting a first defocus amount by executing a first filter processing to the pair of focus detection signals;
a determination step of determining a focus state on the basis of the first defocus amount;
an evaluation value generation step of generating an evaluation value of the first defocus amount by executing a second filter processing to the pair of focus detection signals in accordance with a result of the determination about the focus state; and
a control step of evaluating the result of the determination about the focus state on the basis of the evaluation value and controlling the focus adjustment in accordance with a result of the evaluation.

17. A control method of a focus adjustment apparatus for performing a focus adjustment by using a pair of focus detection signals which are output from an imaging unit which includes a plurality of photoelectric conversion elements corresponding to one microlens, wherein a plurality of the microlenses are two-dimensionally arranged, comprising:
a focus detection step of detecting a first defocus amount by executing a first filter processing to the pair of focus detection signals;
a determination step of determining a focus state on the basis of the first defocus amount;
an evaluation value generation step of generating an evaluation value of the first defocus amount by executing a second filter processing to the pair of focus detection signals in accordance with a result of the determination about the focus state; and
a control step of evaluating the result of the determination about the focus state on the basis of the evaluation value and controlling the focus adjustment in accordance with a result of the evaluation.

18. A non-transitory computer-readable storage medium storing a program for controlling a focus adjustment apparatus for performing a focus adjustment by using an output signal which is output from an imaging unit configured to output a pair of focus detection signals by photoelectrically converting rays of light which passed through different pupil areas of a focusing optical system, wherein the program comprises a program code for causing a computer to function as:
a focus detection unit configured to detect a first defocus amount by executing a first filter processing to the pair of focus detection signals;
a determination unit configured to determine a focus state on the basis of the first defocus amount;
an evaluation value generation unit configured to generate an evaluation value of the first defocus amount by executing a second filter processing to the pair of focus detection signals in accordance with a result of the determination about the focus state; and
a control unit configured to evaluate the result of the determination about the focus state on the basis of the evaluation value and control the focus adjustment in accordance with a result of the evaluation.

19. A non-transitory computer-readable storage medium storing a program for controlling a focus adjustment apparatus for performing a focus adjustment by using an output signal which is output from an imaging unit which includes a plurality of photoelectric conversion elements corresponding to one microlens, wherein a plurality of the microlenses are two-dimensionally arranged, wherein the program comprises a program code for causing a computer to function as:
a focus detection unit configured to detect a first defocus amount by executing a first filter processing to the pair of focus detection signals;
a determination unit configured to determine a focus state on the basis of the first defocus amount;
an evaluation value generation unit configured to generate an evaluation value of the first defocus amount by executing a second filter processing to the pair of focus detection signals in accordance with a result of the determination about the focus state; and
a control unit configured to evaluate the result of the determination about the focus state on the basis of the evaluation value and control the focus adjustment in accordance with a result of the evaluation.

20. A focus adjustment apparatus comprising:
an imaging unit which includes a plurality of photoelectric conversion elements corresponding to one microlens, wherein a plurality of the microlenses are two-dimensionally arranged;
a focus detection unit configured to detect a first defocus amount by executing a first filter processing to a pair of focus detection signals which are output from an output unit;
an evaluation value generation unit configured to generate an evaluation value of the first defocus amount by executing a second filter processing to the pair of focus detection signals; and
a control unit configured to control a focus adjustment in accordance with the first defocus amount and the evaluation value.

21. An apparatus according to claim 20, wherein the first filter processing is a differential filter processing.

22. An apparatus according to claim 21, wherein the second filter processing is an additive filter processing.

23. An apparatus according to claim 20, wherein the evaluation value generation unit executes the second filter processing to the pair of focus detection signals, detects a second defocus amount, and sets the second defocus amount into the evaluation value.

24. An apparatus according to claim 20, wherein the evaluation value generation unit generates the evaluation value by using a correlation amount generated by executing the second filter processing to the pair of focus detection signals.

25. An apparatus according to claim 20, wherein the detection of the first defocus amount by the focus detection unit and the generation of the evaluation value by the evaluation value generation unit are performed in parallel.

26. A focus adjustment apparatus comprising:
an imaging unit which includes a plurality of photoelectric conversion elements corresponding to one microlens, wherein a plurality of the microlenses are two-dimensionally arranged;
a focus detection unit configured to detect a defocus amount by executing a differential filter processing to a pair of focus detection signals which are output from an output unit;
an evaluation value generation unit configured to generate an evaluation value by executing an additive filter processing to the pair of focus detection signals; and
a control unit configured to control a focus adjustment in accordance with the defocus amount and the evaluation value.

27. A control method of a focus adjustment apparatus for performing a focus adjustment by using a pair of focus detection signals which are output from an imaging unit which includes a plurality of photoelectric conversion elements corresponding to one microlens, wherein a plurality of the microlenses are two-dimensionally arranged, comprising:
detecting a defocus amount by executing a first filter processing to the pair of focus detection signals;
generating an evaluation value of the defocus amount by executing a second filter processing to the pair of focus detection signals; and
controlling a focus adjustment in accordance with the defocus amount and the evaluation value.

28. A control method of a focus adjustment apparatus for performing a focus adjustment by using a pair of focus detection signals which are output from an imaging unit which includes a plurality of photoelectric conversion elements corresponding to one microlens, wherein a plurality of the microlenses are two-dimensionally arranged, comprising:
detecting a defocus amount by executing a differential filter processing to the pair of focus detection signals;
generating an evaluation value of the defocus amount by executing an additive filter processing to the pair of focus detection signals; and
controlling a focus adjustment in accordance with the defocus amount and the evaluation value.

29. A non-transitory computer-readable storage medium storing a program for controlling a focus adjustment apparatus for performing a focus adjustment by using a pair of focus detection signals which are output from an imaging unit which includes a plurality of photoelectric conversion elements corresponding to one microlens, wherein a plurality of the microlenses are two-dimensionally arranged, comprising:
detecting a defocus amount by executing a first filter processing to the pair of focus detection signals;
generating an evaluation value of the defocus amount by executing a second filter processing to the pair of focus detection signals; and
controlling a focus adjustment in accordance with the defocus amount and the evaluation value.

30. A non-transitory computer-readable storage medium storing a program for controlling a focus adjustment apparatus for performing a focus adjustment by using a pair of focus detection signals which are output from an imaging unit which includes a plurality of photoelectric conversion elements corresponding to one microlens, wherein a plurality of the microlenses are two-dimensionally arranged, comprising:
detecting a defocus amount by executing a differential filter processing to the pair of focus detection signals;
generating an evaluation value of the defocus amount by executing an additive filter processing to the pair of focus detection signals; and
controlling a focus adjustment in accordance with the defocus amount and the evaluation value.

* * * * *